United States Patent [19]

Krajewski

[11] 4,047,132

[45] Sept. 6, 1977

[54] MULTILAYER PRINTED CIRCUIT BOARDS

[75] Inventor: Ignacy Krajewski, Poynton, England

[73] Assignee: International Computers Limited, London, England

[21] Appl. No.: 698,021

[22] Filed: June 21, 1976

[30] Foreign Application Priority Data

June 20, 1975    United Kingdom ............... 26256/75

[51] Int. Cl.² ............................................. H01P 3/08
[52] U.S. Cl. ................................. 333/84 M; 361/414
[58] Field of Search ............. 333/84 M; 317/101 CE, 317/101 CM

[56] References Cited

U.S. PATENT DOCUMENTS

| | | | |
|---|---|---|---|
| 3,155,881 | 11/1964 | St. Jean | 317/101 CM |
| 3,533,023 | 10/1970 | Friend et al. | 333/84 M |
| 3,792,383 | 2/1974 | Knappenberger | 317/101 CM X |

*Primary Examiner*—Paul L. Gensler
*Attorney, Agent, or Firm*—Hane, Sullivan & Spiecens

[57] ABSTRACT

The present invention is concerned with multilayer printed circuit boards which have more than a single plane of interconnection conductors spaced away from a common plane, such as an earth or power plane. In such a case the conductors of the interconnection layers form transmission lines having respectively different impedances, depending on their distances from the common plane. The invention contemplates a pattern of conductive areas distributed over one of the surfaces of the multilayer board, the surface chosen lying on the opposite side of the planes of conductors from the common plane, the pattern configuration being chosen more nearly to equalize the impedances of the conductors. The areas of the pattern are preferably connected to the common plane.

7 Claims, 1 Drawing Figure

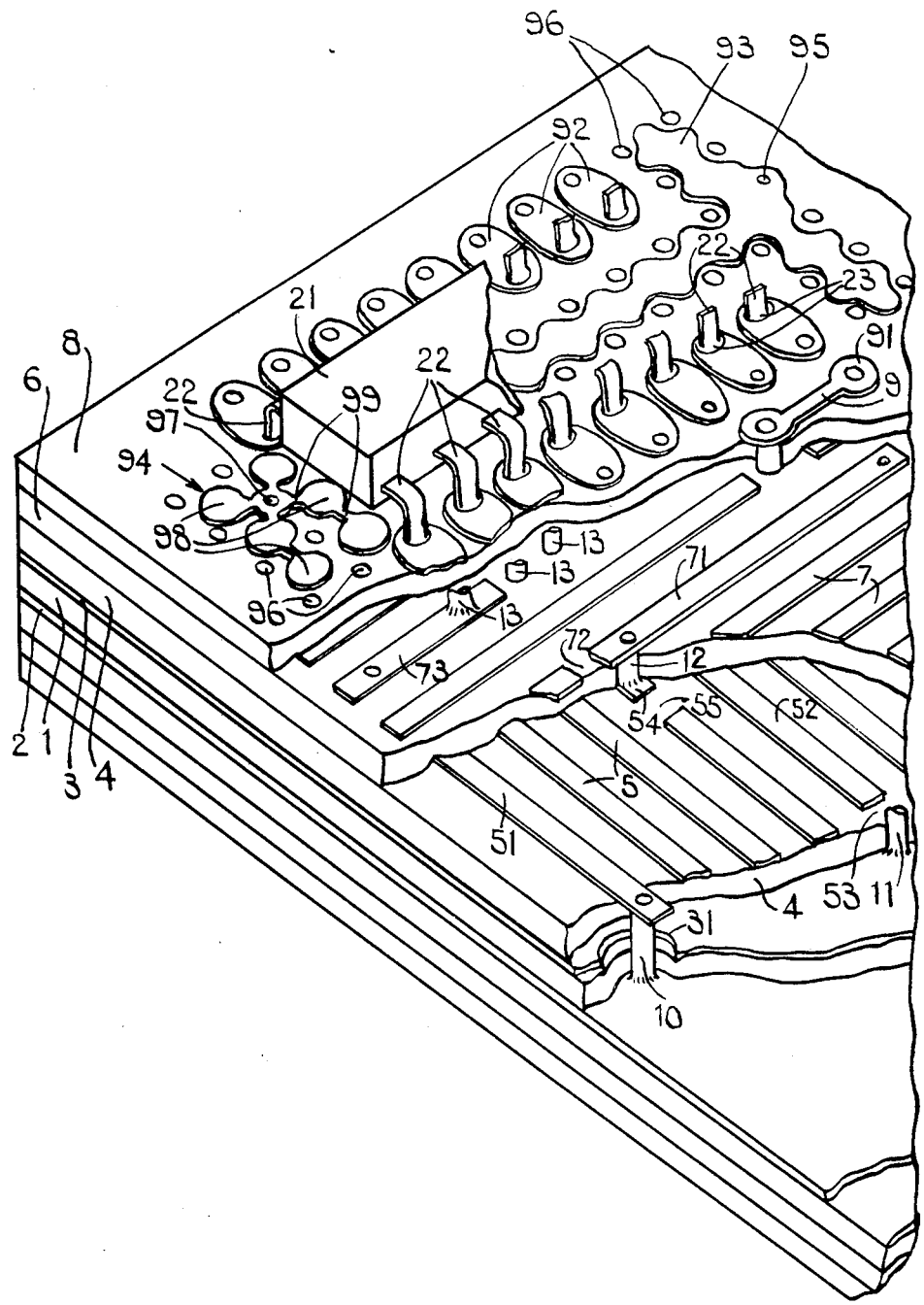

MULTILAYER PRINTED CIRCUIT BOARDS

BACKGROUND OF THE INVENTION

1. Field of the Invention

The present invention relates to multilayer printed circuit boards.

2. Description of the Prior Art

It has previously been proposed to provide circuit boards which carry a pattern of conductors and on to which components may be assembled, the pattern of conductors forming the wiring of a circuit or circuits of which the assembled components form the operative elements. As such circuit boards have developed, so have the available components and the boards are usually now produced by the use of printed circuit techniques. The necessity for quite complex circuit wiring has led to the development of multilayer circuit boards in which wiring patterns are distributed over two or more levels within the thickness of the board. Such multilayer boards are frequently formed by laminating several discrete layers and it is common to provide, as one or more of the inner layers of such boards, electrically conductive sheets frequently termed planes, which are supplied with electrical power and used to distribute the electrical power supplies throughout the board. Such layers, which also serve as screens within the board, are frequently referred to as power supply planes.

SUMMARY OF THE INVENTION

In accordance with the present invention a multilayer printed circuit board includes more than one layer of conductors lying on the same side of and spaced respectively at different distances from a conductive plane, the conductors forming with the conductive plane transmission lines, having natural characteristic impedances which vary according to the separation between the respective layers and the conductive plane and a pattern of one or more conductive areas lying in a plane parallel to said conductive plane, the conductors lying between the conductive plane and the conductive area pattern, the areas of the pattern being connected to said conductive plane and the configuration of the pattern being chosen to bring the effective characteristic impedances of the conductors more nearly into balance.

BRIEF DESCRIPTION OF THE DRAWING

A circuit board to which the invention is applied will now be described, by way of example, with reference to the accompanying drawing which illustrates a cutaway view of part of such a board.

DESCRIPTION OF THE PREFERRED EMBODIMENTS

Referring now to the drawing, it is to be realised that the relative sizes and dispositions of the various components and features to be described are exaggerated for clarity of illustration and are not to be taken as indicative of the proportions or sizes of an actual printed circuit board.

In a multilayer circuit board as shown in the drawing, a central layer 1 is of electrically insulating material and layers 2 and 3 respectively one on each side of the insulating layer 1, are electrically conductive to form power supply planes. The remaining layers making up the complete circuit board are arranged symmetrically about the central layer 1, so that it is necessary to describe in detail only the arrangement of the upper layers of the board as shown. The central core consisting of the layers 1, 2 and 3 are conveniently formed by a commercially available "double-sided" copper clad laminate.

Over the conductive layer 3 is another insulating layer 4 and, above this layer 4, two mutually perpendicular groups of parallel conductors are arranged in layers 5 and 7 respectively, separated by an insulating layer 6. These conductors are coveniently formed, e.g. by etching, from further copper-clad laminate, the insulating base of which then forms the insulating layer 6 between the conductor groups 5 and 7. Finally, yet another insulating layer 8 is provided over the conductors 7 and a pattern of conductive interconnections, such as that referenced 9 in the drawing is formed, for example by deposition, on the exposed face of the layer 8. The pattern of the interconnections is, of course, determined by the circuit requirements of the particular circuit board concerned.

Interlayer connections are provided, again as the requirements of the circuit board dictate, for example by means of plated-through holes provided in the various insulating layers, this plating technique being well understood for the production of printed circuit boards. By way of example, interlayer connectors 10 and 11 are shown in the drawing in association with the conductive layers 2 and 3 to illustrate the manner in which these layers may be connected to the various conductors in the layers of the board. In use, these layers 2 and 3 serve both as power supply planes and as screens. Thus, in the drawing, the plane 2, which, for example could serve as an earth plane in use, is connected to a hollow cylinder of conductive material 10, representing the conductive lining of a plated-through hole in a part of layers 1 and 4 which has, for the sake of the present explanation, been omitted from the drawing. The opposite end of the interlayer connector 10 is connected to one (51) of the conductors 5. It will also be seen that the interlayer connector 10 passes through the conductive layer or plane 3 in its passage from the plane 2 to the conductor 51 and it is to be noted that a large hole 31 is provided in the plane 3 to isolate the plane 3 from the connector 10.

In a somewhat similar manner, this second conductive plane 3 is shown as connected to the further interlayer connector 11 and in this case the connector 11 passes through the layer 4 and continues through the layer 6 to a conductor in an upper layer. It will be noted that one conductor 52 of the conductors 5 is broken at 53 to isolate the connector 11 from the line 52.

Other interlayer connectors are provided as may be required. For example, a connector 12 is provided between one (54) of the conductors 5 and one (71) of the conductors 7. The conductors 54 and 71 are both broken at points 55 and 72 respectively to isolate the connected conductors from other circuits. It will readily be seen that, by using interlayer connectors 10 in association with selected ones of the conductors 5 and 7 a complex circuit may be built up on the multilayer board and, for the purposes of establishing connections with components subsequently to be mounted on the board, other necessary interconnections may also be formed on the outerfaces of the board. Interconnections for this purpose on known boards, for example, have usually taken a form exemplified in the present drawing by the connection 9, which provides a parallel-sided conductor terminating at each end in circular pad 91 to which, for example, a through-plated interlayer onnector is connected.

Through-plated holes are also used, as in known conventional circuit boards, to provide connections to components to be mounted on the boards. Thus, for example, components with flying leads may be mounted by passing the leads through plated holes in the boards to extend beyond the furthermost surface of the board and then securing these leads to conductive pads at this surface by, for example, flow-soldering. In such cases, the through-plating of the hole may extend right through the board to permit an interconnection pattern to be formed on the board surface nearer to the component, or the hole plating may be connected to a conductor or a conductive plane within the thickness of the board and an interconnection pattern may also be provided on the surface of the board remote from the component itself. In the present case, as shown in the drawing, a component 21 (e.g. a so-called DILIC of "Dual-In-Line-Integrated-Circuit") has a number of flying leads 22 along each of two opposite sides. The leads 22 are formed to pass through plated-through holes 23 which are also connected to interconnections 92 to enable the leads 22 to be connected through interlayer connectors 13 to internal conductors such as 73.

It will be realised that the circuit interconnections illustrated in the drawing are intended to show typical ways in which the various layers of the circuit boards may be connected, and that the precise interconnections actually to be provided for any particular board are determined by the circuit which the board is required to provide. It is usual, in practice, for circuit connections from an interconnecting pad such as 92 to a power supply plane to be made directly by a single interlayer connector and for the conductors 5 and 7 to be used mainly as signal-carrying routes throughout the board for input and output connections and for interconnections from one component to another.

Consideration of the arrangement of the circuit conductors provided by the board will show that the conductors 5 and 7 can be regarded as forming transmission lines with the planes 2 and 3 forming the conventional screens, the planes 2 and 3 being, in practice, both connected to a steady DC potential. It will be seen, however, that, considering only the layers of the upper half of the board as shown, the conductors 5 are spaced closer to their nearest screen (the plane 3) than are the conductors 7. This means that the natural characteristic impedances of the conductors 5 and 7 respectively are different, that of the conductors 7 being higher than that of the conductors 5. It is desirable that the impedances of the conductors 5 and 7 should be balanced. However, in balancing, it is also desirable that the characteristic impedances should not be unduly reduced. Thus the provision of an additional screen above the conductors 7 in the assembly shown, because it would link capacitively with both conductors 5 and 7, could produce an impedance match at the expense of an unacceptably low characteristic impedance for both sets of conductors.

It is found, in accordance with the present invention, that an acceptable compromise greatly to improve impedance matching without unduly reducing the characteristic impedance results from providing a modified configuration for the pattern of areas of conductive material on the outermost surfaces of the board to increase its area. This conductive area pattern may take two forms which may be used alternatively or in combination.

Firstly, the area of each circuit interconnection may be increased. Thus, instead of the conventional form for these interconnections, as exemplified by the interconnection 9, the interconnecting pads 92 are greatly increased in area to become oval. Although these circuit interconnections are not all connected directly to a D.C. source but normally are signal lines interconnecting various parts of the circuit, it will be realized that, in practice, such signal lines tend to be at one or another voltage level for most of the time and their levels are actually changing only while the signals that they are carrying are being switched. Even when some of the signal leads are changing, however, the overall effect of all the interconnections results in an averaging out of their combined contribution to impedance matching. Moreover, it will also be realised that at least some of the pads 92 are, in fact, actually power supply terminals and, as such, are connected directly to one or other of the power supply planes 2 and 3.

Secondly, the pattern of areas of conductive material provided for impedance matching may comprise areas of material which are isolated from the circuit interconnections but which are connected to a conductive plane. Two such areas, 93 and 94, are shown in the drawing. The first area 93 consists of two strips in the form of a T, the strips having wavy edges to project into spaces between the holes of a row in the board. This is a particularly useful pattern for use with a circuit board having through-plated holes such as holes 96, arranged on a grid formation, where the interior circuit links are then provided by forming breaks in the conductors 5 and 7 as required by the circuit. The area 93 is conveniently connected to one of the planes 2 and 3 by a through-plated connection in one of the holes such as 95.

The second area 94 is built up around a connection to one of the planes 2 or 3, the connection being made by means of a through-plated hole 97. Circular pads 98 of conductive material are then provided about the hole 97 and in the space bounded by adjacent fourhole groups of holes 96 within the grid configuration, the pads 98 being joined together by links 99 of the conductive material.

By way of illustration of the effectiveness of the presently proposed provision of areas of conductive material apart from that required merely to establish the requisite circuits, it has been found that, using a printed circuit board similar to that shown in the drawing with holes in grid configuration lying on the corners of squares of 0.1 inches (approx. 25mm) sides and with insulation layers 1, 4, 6 and 8 of the order of 0.006 – 0.010 inches (0.15 – 0.25mm) thick, the impedance of the transmission lines formed by the conductors 7 is reduced from approximately 90 ohms to of the order of some 70 ohms, acceptably to match the impedance of the lines formed by conductors 5.

In order better to match the impedances of the lines, it has been found convenient to provide a proportion of the conductive material on the surface of the boards by using a pattern, such as the pattern 94, in which larger areas are joined together by small links, such as the links 99, the links 99 then being severable to assist in final adjustment of the match.

I claim:
1. A multilayer printed circuit assembly including
   a planar conductive layer;
   a plurality of contact pads arranged in a first plane spaced from said conductive layer and parallel thereto, the contact pads being disposed for connection to circuit components and occupying only part of the area of said first plane;

a plurality of first conductors extending in a second plane;

a plurality of second conductors extending in a third plane, said second and third planes lying between said conductive layer and said first plane;

electrical connections between the contact pads and selected ones of said first and second conductors;

and a plurality of conductive areas occupying at least some of the remainder of the area of said first plane, being electrically connected to said conductive plane and being effective in conjunction with the conductive plane to cause the characteristic impedances of the first and second conductors to be approximately equal.

2. An assembly as claimed in claim 1 in which the conductive areas include portion joined together by links severable to provide means for adjusting the extent of the conductive areas.

3. An assembly as claimed in claim 1 in which some of the contact pads are connected to some of the conductive areas.

4. An assembly as claimed in claim 1 in which the conductive plane is electrically connected to a supply potential.

5. An assembly as claimed in claim 1 in which selected ones of said first and second conductors are electrically connected to one another by plated through-hole connections.

6. An assembly as claimed in claim 1 in which selected ones of said first and second conductors are electrically connected to said conductive plane by plated through-hole connectors.

7. In a multilayer printed circuit assembly including a planar conductive layer;

a plurality of contact pads arranged in a first plane spaced from said conductive layer and parallel thereto, the contact pads being disposed for connection to circuit components and occupying only part of the area of said first plane;

a plurality of first conductors extending in a second plane;

a plurality of second conductors extending in a third plane, said second and third planes lying between said conductive layer and said first plane;

said first and second conductors having different characteristic impedances due to their respective different distances from the planar conductive layer;

the improvement consisting in providing in selected portions of the remainder of the area of said first plane a plurality of conductive areas electrically connected to said conductive plane effective to change the characteristic impedances of the first and second conductors to values which are approximately equal.

* * * * *